(12) United States Patent
Bak et al.

(10) Patent No.: US 11,522,015 B2
(45) Date of Patent: Dec. 6, 2022

(54) VARIABLE RESISTANCE MEMORY DEVICE

(71) Applicant: SAMSUNG ELECTRONICS CO., LTD., Suwon-si (KR)

(72) Inventors: Junghoon Bak, Suwon-si (KR); Woojin Kim, Hwaseong-si (KR); Junghwan Moon, Seoul (KR); Seowon Lee, Gwangmyeong-si (KR); Nayoung Ji, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 324 days.

(21) Appl. No.: 16/789,546

(22) Filed: Feb. 13, 2020

(65) Prior Publication Data

US 2021/0020695 A1 Jan. 21, 2021

(30) Foreign Application Priority Data

Jul. 19, 2019 (KR) .................. 10-2019-0087804

(51) Int. Cl.
*H01L 27/24* (2006.01)
*G11C 13/00* (2006.01)
*H01L 27/22* (2006.01)

(52) U.S. Cl.
CPC ........ *H01L 27/249* (2013.01); *G11C 13/0026* (2013.01); *G11C 13/0028* (2013.01); *H01L 27/224* (2013.01)

(58) Field of Classification Search
CPC . H01L 27/249; H01L 27/224; H01L 27/2463; H01L 27/2409; H01L 43/08; H01L 43/02; H01L 45/1233; G11C 13/0026; G11C 13/0028; G11C 11/161; G11C 11/1675
See application file for complete search history.

(56) References Cited

U.S. PATENT DOCUMENTS

| | | |
|---|---|---|
| 8,587,988 B2 | 11/2013 | Linn et al. |
| 9,324,402 B2 | 4/2016 | Wu et al. |
| 9,620,188 B2 | 4/2017 | Manipatruni et al. |
| 10,020,039 B2 | 7/2018 | Fukami et al. |
| 10,096,770 B2 | 10/2018 | Shimizu et al. |
| 10,157,669 B2 * | 12/2018 | Johnson ............. G11C 13/0007 |
| 10,404,286 B2 | 9/2019 | Sin et al. |
| 2017/0352702 A1 | 12/2017 | Braganca et al. |
| 2017/0365777 A1 | 12/2017 | Mihajlovic et al. |
| 2018/0033956 A1 | 2/2018 | Hyunsoo et al. |
| 2018/0061467 A1 | 3/2018 | Kan et al. |

(Continued)

FOREIGN PATENT DOCUMENTS

| | | |
|---|---|---|
| JP | 6271653 B1 | 1/2018 |
| KR | 10-2018-0061870 A | 6/2018 |
| WO | WO 2017-052622 A1 | 3/2017 |

*Primary Examiner* — Allison Bernstein
(74) *Attorney, Agent, or Firm* — Lee IP Law, P.C.

(57) ABSTRACT

A variable resistance memory device includes a first conductive line, a bipolar selection device on the first conductive line and electrically connected to the first conductive line, a second conductive line on the first conductive line and electrically connected to the bipolar selection device, a variable resistance layer on the second conductive line and electrically connected to the second conductive line, and a third conductive line on the variable resistance layer and electrically connected to the variable resistance layer.

19 Claims, 18 Drawing Sheets

(56) References Cited

U.S. PATENT DOCUMENTS

| | | |
|---|---|---|
| 2018/0151210 A1 | 5/2018 | Li et al. |
| 2018/0277595 A1* | 9/2018 | Miyakawa .......... H01L 29/7827 |
| 2019/0043547 A1 | 2/2019 | DeBrosse et al. |
| 2020/0350364 A1* | 11/2020 | Wan ..................... H01L 27/228 |

* cited by examiner

US 11,522,015 B2

VARIABLE RESISTANCE MEMORY DEVICE

CROSS-REFERENCE TO RELATED APPLICATION

Korean Patent Application No. 10-2019-0087804, filed on Jul. 19, 2019, in the Korean Intellectual Property Office, and entitled: "Variable Resistance Memory Device," is incorporated by reference herein in its entirety.

BACKGROUND

1. Field

Embodiments relate to a memory device, and more particularly, to a variable resistance memory device.

2. Description of the Related Art

Variable resistance memory devices use the current transfer characteristic of a variable resistance layer based on an applied voltage and are attracting much attention as memory devices for replacing flash memory devices. Representative examples of variable resistance memory devices may include magnetic random access memory (RAM) (MRAM), phase change RAM (PRAM), and resistance RAM (RRAM). Variable resistance memory devices need a memory cell array which has a reduced size and enables data "1" and "0" to be easily written and read in and from memory cells.

SUMMARY

According to an aspect of embodiments, there is provided a variable resistance memory device including a first conductive line, a bipolar selection device on the first conductive line and electrically connected to the first conductive line, a second conductive line on the first conductive line and electrically connected to the bipolar selection device, a variable resistance layer on the second conductive line and electrically connected to the second conductive line, and a third conductive line on the variable resistance layer and electrically connected to the variable resistance layer.

According to another aspect of embodiments, there is provided a variable resistance memory device including a plurality of word lines apart from one another in a second direction vertical to a first direction to extend in the first direction, a plurality of source lines on the plurality of word lines, each of the plurality of source lines including a plurality of main source lines apart from one another in the first direction to extend in the second direction and a plurality of sub-source lines apart from one another in the second direction to extend in the first direction from the plurality of main source lines and provided in opposite directions along the plurality of main source lines, a plurality of bit lines on the plurality of word lines and the plurality of sub-source lines to extend in the second direction between the plurality of main source lines and provided apart from one another in the first direction, a plurality of variable resistance layers at intersection portions of the plurality of word lines and the plurality of bit lines on the plurality of sub-source lines, and a plurality of bipolar selection devices between the plurality of word lines and the plurality of sub-source lines and apart from the intersection portions.

According to yet another aspect of embodiments, there is provided a variable resistance memory device including a plurality of word lines apart from one another in a second direction vertical to a first direction to extend in the first direction, a plurality of bit lines on the plurality of word lines to extend in the second direction and apart from one another in the first direction, a plurality of source lines between the plurality of word lines and the plurality of bit lines, each of the plurality of source lines including a plurality of main source lines apart from one another in the first direction to extend in the second direction between the plurality of bit lines and a plurality of sub-source lines apart from one another in the second direction to cross the plurality of bit lines and extend in the first direction from the plurality of main source lines and in opposite directions along the plurality of main source lines, a plurality of variable resistance layers at intersection portions of the plurality of word lines and the plurality of bit lines on the plurality of sub-source lines and electrically connected to the plurality of bit lines and the plurality of sub-source lines, each of the plurality of variable resistance layers including a spin orbit torque magnetic tunnel junction device, and a plurality of bipolar selection devices between the plurality of word lines and the plurality of sub-source lines, apart from the intersection portions, and electrically connected to the plurality of sub-source lines and the plurality of word lines, each of the plurality of bipolar selection devices including a bipolar diode.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described in detail with reference to the accompanying drawings. Each of the following embodiments may be implemented individually, and one or more of the following embodiments may be combined.

Figure 1:
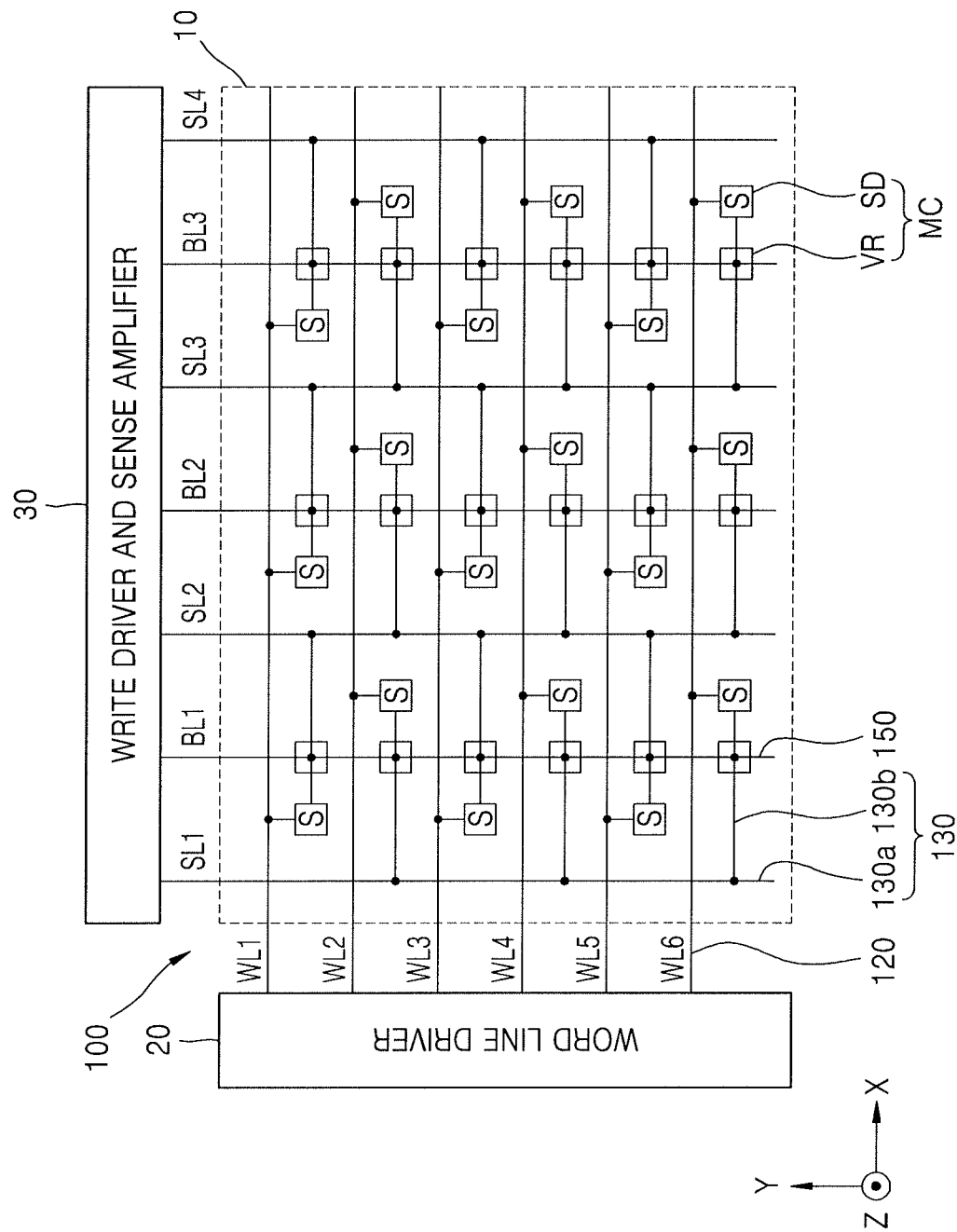
FIG. 1 illustrates a circuit diagram of a variable resistance memory device according to an embodiment.

FIG. 1 is a circuit diagram of a variable resistance memory device 100 according to an embodiment.

Referring to FIG. 1, the variable resistance memory device 100 may include a memory cell array 10, a word line driver region 20, and a write driver and sense amplifier region 30. The memory cell array 10 may include a plurality of unit memory cells MC, which are arranged in a matrix. Each of the unit memory cells MC may include a variable resistance layer VR and a bipolar selection device SD. Hereinafter, each of the unit memory cells MC may be referred to as a memory cell.

The memory cell array 10 may include a plurality of word lines 120, e.g., first to sixth word lines WL1 to WL6 (120), a plurality of source lines 130, e.g., first to fourth source lines SL1 to SL4 (130), and a plurality of bit lines 150, e.g., first to third bit lines BL1 to BL3 (150). In FIG. 1, for convenience of description, the number of word lines WL1 to WL6 (120), the number of source lines SL1 to SL4 (130), and the number of bit lines BL1 to BL3 (150) are illustrated only as an example.

The memory cell MC illustrated in FIG. 1 may be electrically connected to the word line WL6 of the word lines WL1 to WL6 (120), the source line SL3 of the source lines SL1 to SL4 (130), and the bit line BL3 of the bit lines BL1 to BL3 (150). The memory cells MC may be disposed in opposite directions along the bit lines BL1 to BL3 (150) provided in a second direction (a Y direction), e.g., two memory cells MC adjacent to each other along the second direction and connected to a same bit line may be connected to different source lines on opposite sides of the bit line. Furthermore, the bipolar selection devices SD may be disposed in opposite directions along the bit lines BL1 to BL3 (150) provided in the second direction, e.g., two bipolar selection devices SD of two memory cells MC adjacent to each other along the second direction and connected to a same bit line may be on respective opposite sides of the memory cells MC relative to the bit line.

The variable resistance layer VR may include a material layer having a resistance value which varies. The variable resistance layer VR may have a resistance value corresponding to data "0" and "1". For example, the variable resistance layer VR may have a resistance value, which is lower than a predetermined reference resistance value, and thus, may store data "0". On the other hand, the variable resistance layer VR may have a resistance value, which is higher than the predetermined reference resistance value, and thus, may store data "1". Here, data "0" and "1" based on a resistance value may be merely an embodiment and may be inverted therebetween.

According to an embodiment, the variable resistance layer VR may include a magnetic material. The variable resistance layer VR may include a magnetic tunnel junction (MTJ) device (or a magnetic resistance device). The variable resistance layer VR may perform a memory function by using a spin orbit torque (SOT) phenomenon where a magnetization direction of the magnetic material varies based on an input current. In this case, the variable resistance memory device 100 may be a magnetic random access memory (MRAM) or a magnetic resistance memory device.

The bipolar selection device SD may select a memory cell MC on the basis of a voltage of each of the word lines WL1 to WL6 (120) and the source lines SL1 to SL4 (130). The bipolar selection device SD may include a bipolar diode. The bipolar diode may include, e.g., an Esaki diode, a tunnel diode, or a schottky diode, but is not limited thereto. In FIG. 1, when a current flows in the bipolar selection device SD due to a voltage difference between the word line WL6 (120) and the source line SL3 (130), data may be written in the variable resistance layer VR.

The word lines WL1 to WL6 (120) may be disposed apart from one another in parallel in the second direction (the Y direction) and may extend in a first direction (an X direction). Each of the word lines WL1 to WL6 (120) may be driven by a word line driver of the word line driver region 20. The word line driver region 20 may be disposed in the first direction (the X direction) of the memory cell array 10.

In an embodiment, in order to select one word line, e.g., the sixth word line WL6, from among the word lines WL1 to WL6 (120), the word line driver region 20 may output a voltage to the desired word line, e.g., to the sixth word line WL6. The second direction (the Y direction) may differ from the first direction (the X direction). For example, the second direction (the Y direction) may be a direction vertical to the first direction (the X direction).

The source lines SL1 to SL4 (130) may include a plurality of main source lines 130*a* and a plurality of sub-source lines 130*b*. As in a plan view or a layout view, the source lines SL1 to SL4 (130) may have a fish bone shape. The reason that the source lines SL1 to SL4 (130) are classified into the main source lines 130*a* and the sub-source lines 130*b* is for convenience of description.

The main source lines 130*a* may be disposed apart from one another in parallel in the first direction (the X direction) and may extend in the second direction (the Y direction). The sub-source lines 130*b* may be disposed apart from one another in parallel in the second direction (the Y direction) and may extend from the main source lines 130*a* in the first direction (the X direction).

The sub-source lines 130*b* may cross the bit lines BL1 to BL3 (150) in the first direction (the X direction) and may extend in the first direction (the X direction). The sub-source lines 130*b* may be disposed in opposite directions along the main source lines 130*a* provided in the second direction (the Y direction).

The bit lines BL1 to BL3 (150), like the main source lines 130*a*, may be disposed apart from one another in parallel in the first direction (the X direction) and may extend in the second direction (the Y direction). A plurality of variable resistance layers VR may be disposed at intersection portions or intersection points of the word lines WL1 to WL6 (120) and the bit lines BL to BL3 (130). Therefore, the variable resistance memory device 100 may be a cross-point memory device.

A plurality of bipolar selection devices SD may be electrically connected to the word lines WL1 to WL6 (120) and the sub-source lines 130*b*. The source lines SL1 to SL4 (130) may be connected to the variable resistance layers VR and the bipolar selection devices SD of the memory cells MC.

The bit lines BL1 to BL3 (150) may be connected to first ends of the variable resistance layers VR. The variable resistance layers VR may be connected to first ends of the sub-source lines 130*b*. The variable resistance layers VR may be electrically connected to the sub-source lines 130*b* and the bit lines BL1 to BL3 (150). The source lines SL1 to SL4 (130) and the bit lines BL1 to BL3 (150) may be connected to the write driver and sense amplifier region 30 disposed in the second direction of the memory cell array 10.

A plurality of source line drivers for driving the source lines SL1 to SL4 (130) and a plurality of bit line drivers for driving the bit lines BL1 to BL3 (150) may be disposed in the write driver and sense amplifier region 30. Also, a plurality of sense amplifiers electrically connected to the bit lines BL1 to BL3 (150) may be disposed in the write driver and sense amplifier region 30. The circuit diagram of the memory cell array 10 according to an embodiment is illustrated in FIG. 1, but this is merely an implementation.

In the variable resistance memory device 100, the memory cell MC may include the variable resistance layer VR and the bipolar selection device SD, and as described below, a write operation and a read operation may be performed on the memory cell MC by using three conductive lines (i.e., the word lines WL1 to WL6 (120), the source lines SL1 to SL4 (130), and the bit lines BL to BL3 (150)), thereby decreasing a size of the memory cell array 10.

Also, in the variable resistance memory device 100 according to an embodiment, the variable resistance layer VR of the memory cell MC may be configured with a spin orbit torque (SOT) magnetic tunnel junction device, and a current path may differ in a write operation and a read operation each performed on the memory cell as described below. Therefore, as described below, the variable resistance memory device 100 according to an embodiment may easily write and read data "1" and "0" in the memory cells MC and may prevent disturbance in a read operation.

Figure 2:
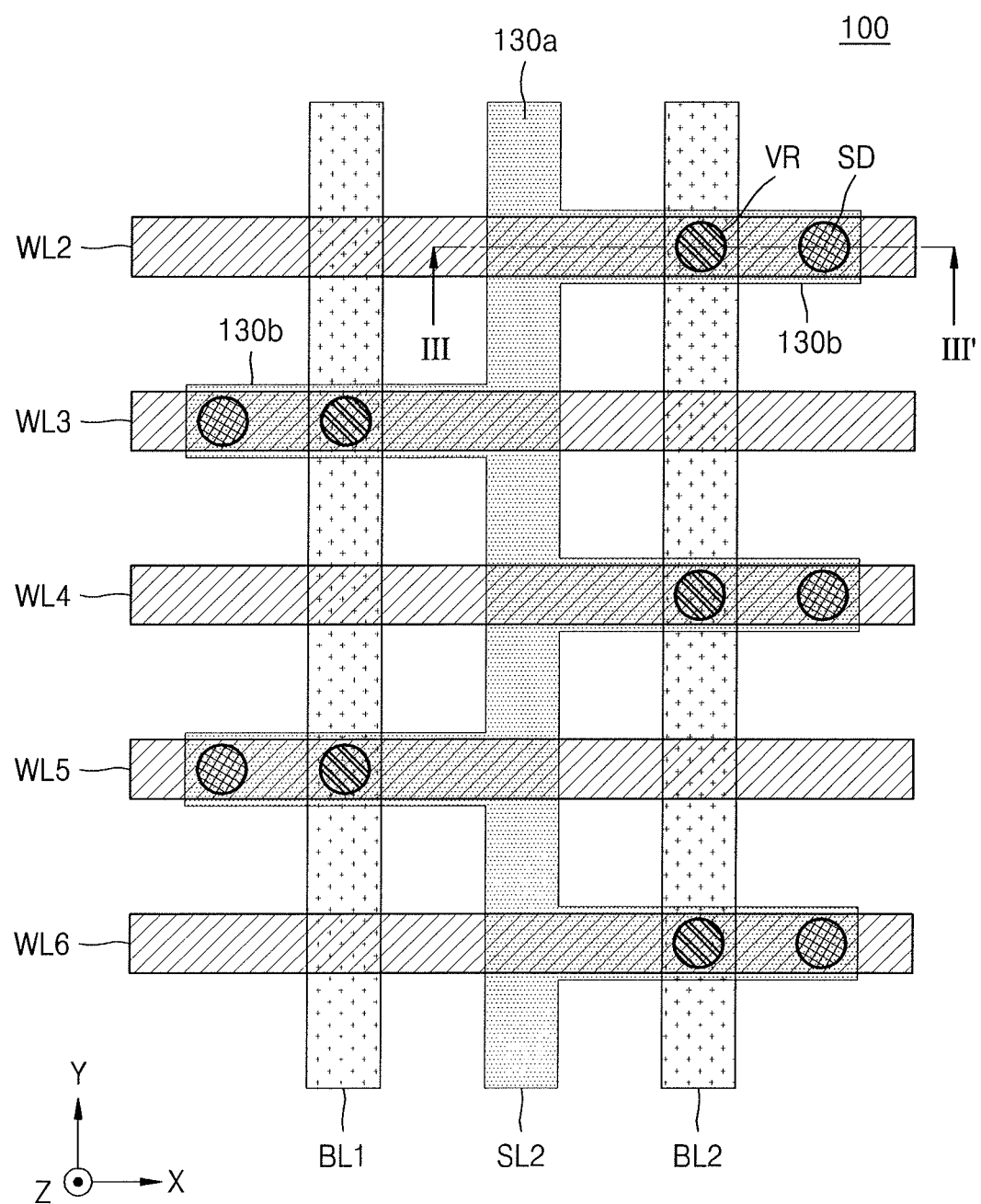
FIG. 2 illustrates a layout view of a variable resistance memory device according to an embodiment.

FIG. 2 is a layout view of a variable resistance memory device according to an embodiment. FIG. 2 refers to a layout view of a portion of FIG. 1. In FIGS. 1 and 2, like reference numerals refer to like elements. FIG. 2 illustrates a variable resistance layer VR and a bipolar selection device SD each connected to one source line SL2, for convenience.

As illustrated in FIG. 2, a portion of the variable resistance memory device 100 may include some word lines, e.g., word lines WL2 to WL6, a source line SL2, and some bit lines, e.g., bit lines BL1 and BL2. The word lines WL2 to WL6 may be disposed apart from one another in parallel in the second direction (the Y direction) and may extend in the first direction (the X direction).

The source line SL2 may include the main source line 130a and the sub-source line 130b. The main source line 130a may extend in the second direction (the Y direction). The main source line 130a may be disposed between the bit lines BL1 and BL2. The main source line 130a and the sub-source lines 130b may each be provided in plurality. The sub-source lines 130b may be disposed apart from one another in parallel in the second direction (the Y direction) and may extend from the main source lines 130a in the first direction (the X direction). As in a plan view or a layout view, the source line SL2 may have a fish bone shape, e.g., the sub-source lines 130b may alternate to extend to opposite directions (e.g., left and right in FIG. 2) relative to the main source line 130a.

The bit lines BL1 and BL2, like the main source lines 130a, may be disposed apart from one another in parallel in the first direction (the X direction) and may extend in the second direction (the Y direction). A plurality of variable resistance layers VR may be disposed at intersection portions of the word lines WL2 to WL6 and the bit lines BL1 and BL2. Therefore, the variable resistance memory device 100 may be a cross-point memory device.

A plurality of bipolar selection devices SD may be disposed to overlap the word lines WL2 to WL6 and the sub-source lines 130b. The bipolar selection devices SD may be disposed to overlap the sub-source line 130b. Therefore, the bipolar selection devices SD may be disposed in opposite directions in the second direction along the main source line 130a.

Figure 3:
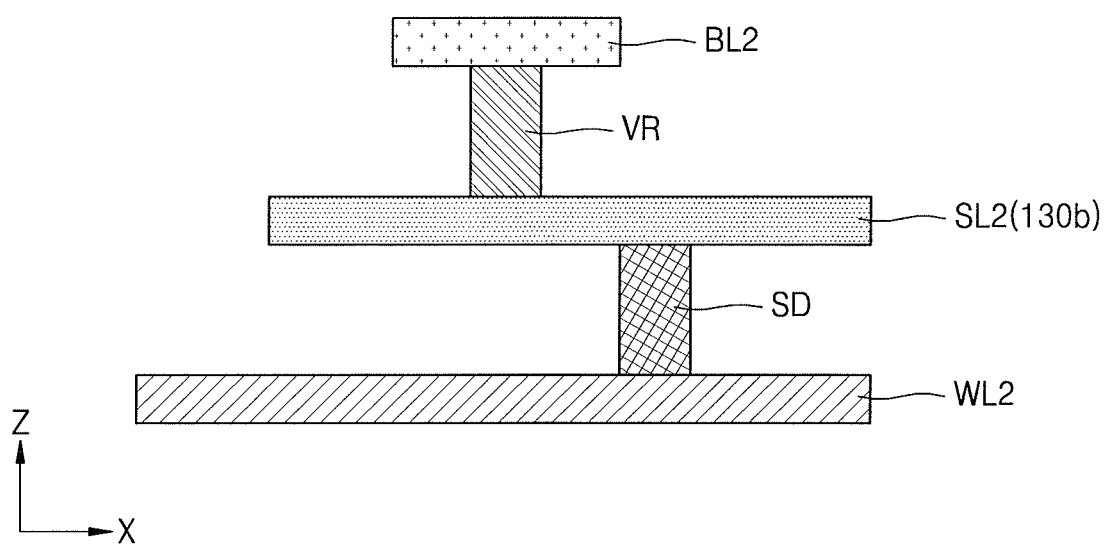
FIG. 3 illustrates a cross-sectional view of a variable resistance memory device taken along line III-III of FIG. 2.

FIG. 3 is a cross-sectional view of a variable resistance memory device taken along line III-III of FIG. 2. In particular, FIG. 3 is a cross-sectional view of a unit memory cell (MC of FIG. 1) of a variable resistance memory device (100 of FIG. 1). In FIGS. 1 to 3, like reference numerals refer to like elements.

As illustrated in FIG. 3, a unit memory cell (MC of FIG. 1) may include a bipolar selection device SD electrically connected to a word line WL2. The word line WL2 may be a first conductive line. A source line SL2 may be disposed on the bipolar selection device SD.

The bipolar selection device SD may be disposed between the word line WL2 and the source line SL2, e.g., the bipolar selection device SD may be directly between and electrically connected to the word line WL2 and the source line SL2. The bipolar selection device SD may be provided on the word line WL2 and may be electrically connected to the word line WL2. The source line SL2 may be a sub-source line 130b. The bipolar selection device SD may be electrically connected to the source line SL2. The source line SL2 may be a second conductive line.

The variable resistance layer VR electrically connected to the source line SL2 may be disposed on the source line SL2. The variable resistance layer VR may be disposed apart from the bipolar selection device SD, e.g., the variable resistance layer VR may be offset from the bipolar selection device SD along the first direction (the X direction) to have a non-overlapping relationship. The bit line BL2 electrically connected to the variable resistance layer VR may be disposed on the variable resistance layer VR. The variable resistance layer VR may be electrically connected to the source line SL2 and the bit line BL2, e.g., the variable resistance layer VR may be directly between and electrically connected to the source line SL2 and the bit line BL2. The bit line BL2 may be a third conductive line.

As described below, the word line WL2 (for example, the first conductive line) electrically connected to the bipolar selection device SD and the source line SL2 (for example, the second conductive line) electrically connected to the variable resistance layer VR may be write lines for writing data "0" or "1" in the variable resistance layer VR. Also, the word line WL2 (for example, the first conductive line) electrically connected to the bipolar selection device SD and the source line SL2 (for example, the second conductive line) and the bit line BL2 (for example, the third conductive line) electrically connected to the variable resistance layer VR may be read lines for reading data "0" or "1" written (stored) in the variable resistance layer VR.

In a variable resistance memory device (100 of FIGS. 1 and 2), a unit memory cell (MC of FIG. 1) may be configured with three conductive lines (i.e., the word line WL2, the source line SL2, and the bit line BL2). Therefore, in a variable resistance memory device (100 of FIGS. 1 and 2), a size of a memory cell array may be reduced.

Figure 4:
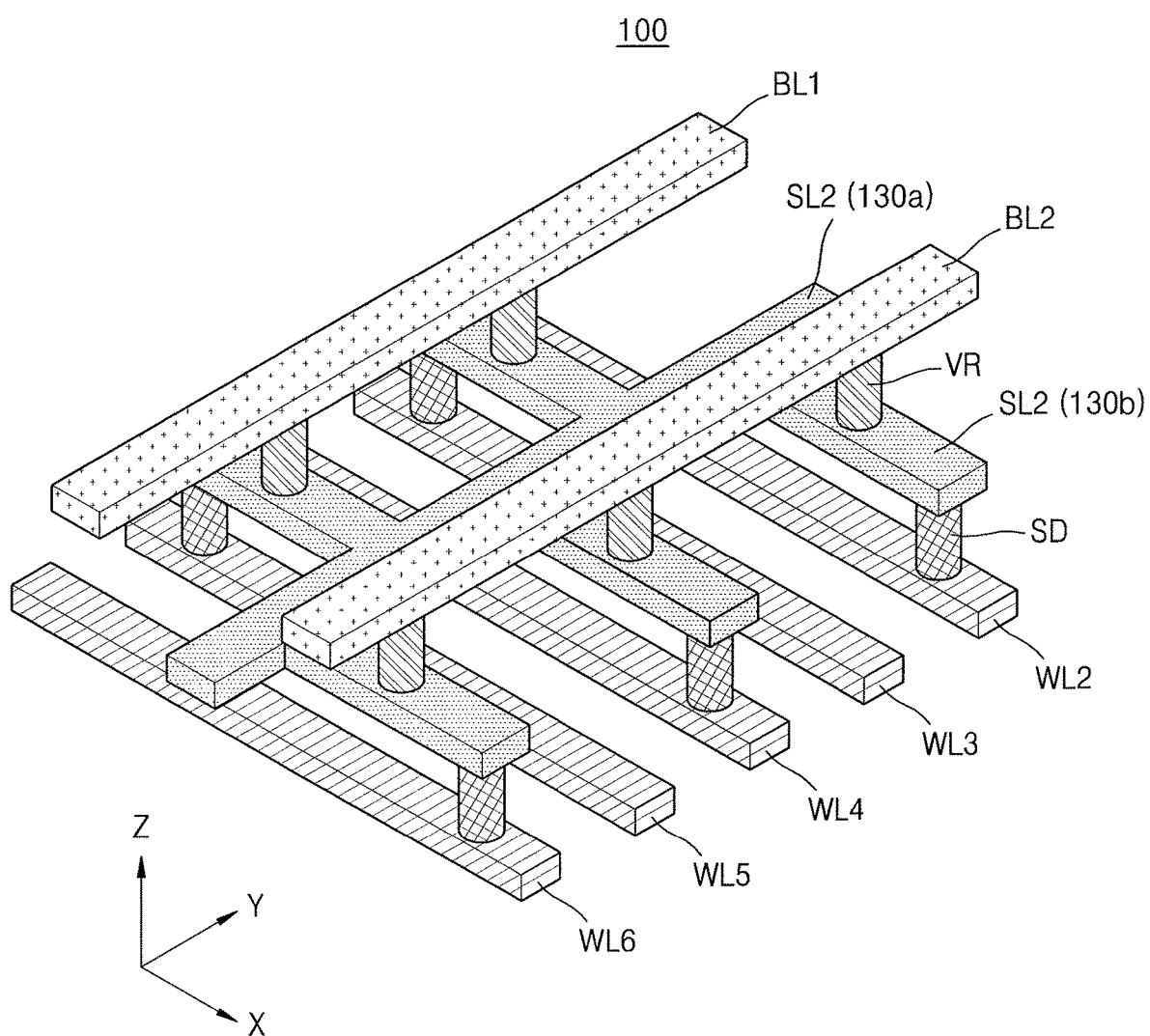
FIG. 4 illustrates a three-dimensional diagram of a variable resistance memory device according to an embodiment.

FIG. 4 is a three-dimensional of a variable resistance memory device according to an embodiment. In particular, FIG. 4 is a three-dimensional diagram of a portion of the variable resistance memory device 100 of FIG. 1. In FIGS. 1 to 4, like reference numerals refer to like elements. FIG.

4 illustrates the variable resistance layer VR and the bipolar selection device SD, each connected to one source line SL2, for convenience.

Referring to FIGS. 1 and 4, the variable resistance memory device 100 may include some word lines, e.g., the word lines WL2 to WL6, the source line SL2, and some bit lines, e.g., the bit lines BL1 and BL2. The word lines WL2 to WL6 may be disposed apart from one another in parallel in the second direction (the Y direction) and may extend in the first direction (the X direction). The source line SL2 may include the main source line 130a and the sub-source line 130b.

The main source line 130a may extend in the second direction (the Y direction). The main source line 130a may be disposed between the bit lines BL1 and BL2. The main source line 130a and the sub-source line 130b may each be provided in plurality. The sub-source lines 130b may be disposed apart from one another in parallel in the second direction (the Y direction) and may extend from the main source lines 130a in the first direction (the X direction). As in a plan view or a layout view, the source line SL2 may have a fish bone shape, e.g., the sub-source lines 130b may alternate to extend to opposite directions (e.g., left and right in FIG. 4) relative to the main source line 130a.

A plurality of bipolar selection devices SD may be disposed between the word lines WL2 to WL6 and corresponding ones of the sub-source lines 130b. The bipolar selection devices SD may be disposed in opposite directions in the second direction along the main source line 130a, e.g., the sub-source lines 130b may alternate in opposite directions along the main source line 130a to have adjacent bipolar selection devices SD in opposite direction relative to the main source line 130a. A plurality of variable resistance layers VR may be disposed between the sub-source lines 130b and the bit lines BL1 and BL2. The variable resistance layers VR may be disposed at intersection portions of the word lines WL2 to WL6 and the bit lines BL1 and BL2. Therefore, the variable resistance memory device 100 may be a cross-point memory device.

Figure 5:
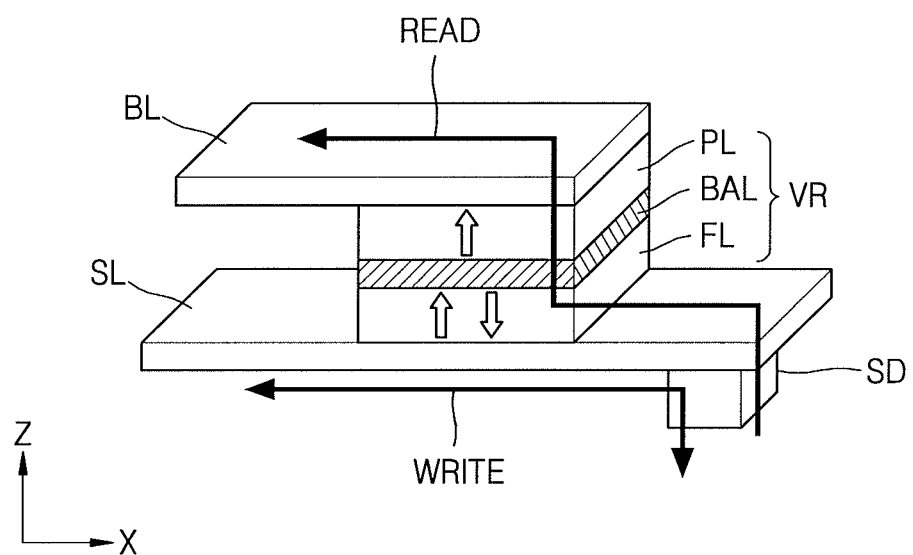
FIG. 5 illustrates a diagram for schematically describing an operation relationship of a memory cell of a variable resistance memory device according to an embodiment.

FIG. 5 is a diagram for schematically describing an operation relationship of a memory cell of a variable resistance memory device according to an embodiment. In FIGS. 1 to 3 and 5, like reference numerals refer to like elements. A memory cell (MC of FIG. 1) may include the variable resistance layer VR and the bipolar selection device SD.

Referring to FIGS. 1-3 and 5, the variable resistance layer VR may include a free layer FL, a barrier layer BAL, and a pinned layer PL. A magnetization direction of the free layer FL may vary based on a condition. The pinned layer PL may be a pinned material layer where a magnetization direction is fixed. The variable resistance layer VR will be described below in detail.

The variable resistance layer VR may include a magnetic tunnel junction (MTJ) device (or a magnetic resistance device). The variable resistance layer VR may be an SOT MTJ device. The SOT MTJ device may be an SOP-based device using a spin hall effect.

The spin hall effect is a phenomenon where, when a current flows in metal having a strong spin orbit bond, spins having different directions are separated from one another and accumulated on a surface. A magnetization direction may be changed by transferring torque to a magnetic layer (i.e., the free layer FL) on which the accumulated spins are disposed. In an SOT-based variable resistance memory device, a path of a current for writing data may be separated from a path of a current for reading data, and thus, a probability that data is transmuted may be low.

When the SOT MTJ device is used as the variable resistance layer VR, a write operation of writing data "0" and "1" in the variable resistance memory device may be performed by applying a horizontal current to a first current path illustrated by an arrow in FIG. 5 between the source line SL and the bipolar selection device SD. The horizontal current may flow in a direction toward the source line SL, the variable resistance layer VR, and the bipolar selection device SD. The horizontal current may flow in a direction toward the bipolar selection device SD, the variable resistance layer VR, and the source line SL.

When the SOT MTJ device is used as the variable resistance layer VR, a read operation of reading data "0" and "1" from the variable resistance memory device may be performed by applying a vertical current to a second current path illustrated by an arrow in FIG. 5 between the bit line BL and the source line SL, e.g., in a single direction. The vertical current may flow in a direction toward the bipolar selection device SD, the source line SL, and the bit line BL. As described above, in the variable resistance memory device according to an embodiment, a current path of a write operation may differ from a current path of a read operation. An operation of the variable resistance memory device will be described below in more detail.

Figure 6:
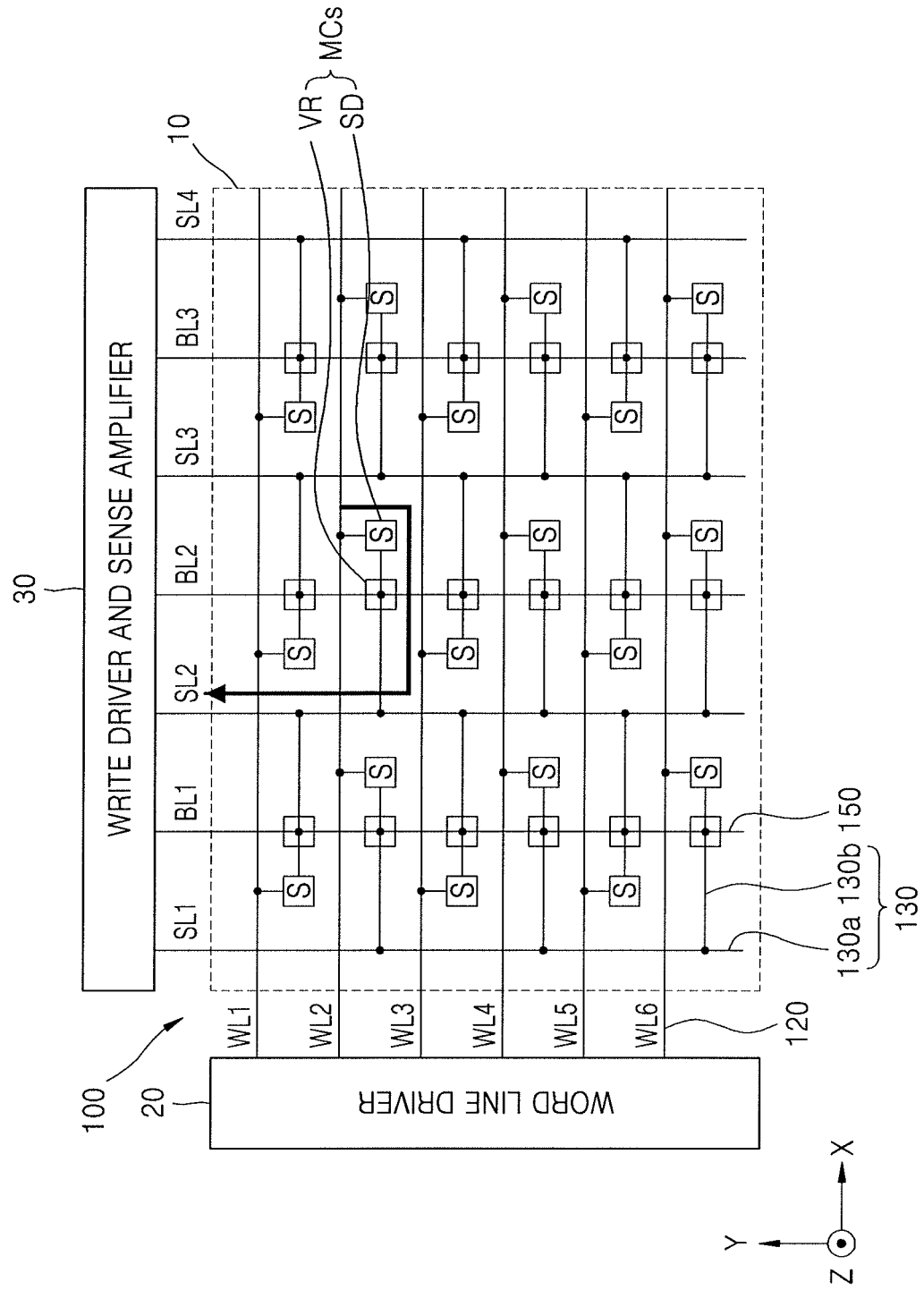
FIGS. 6 to 8 illustrate diagrams for describing writing data "0" in a variable resistance memory device according to an embodiment.
Figure 7:
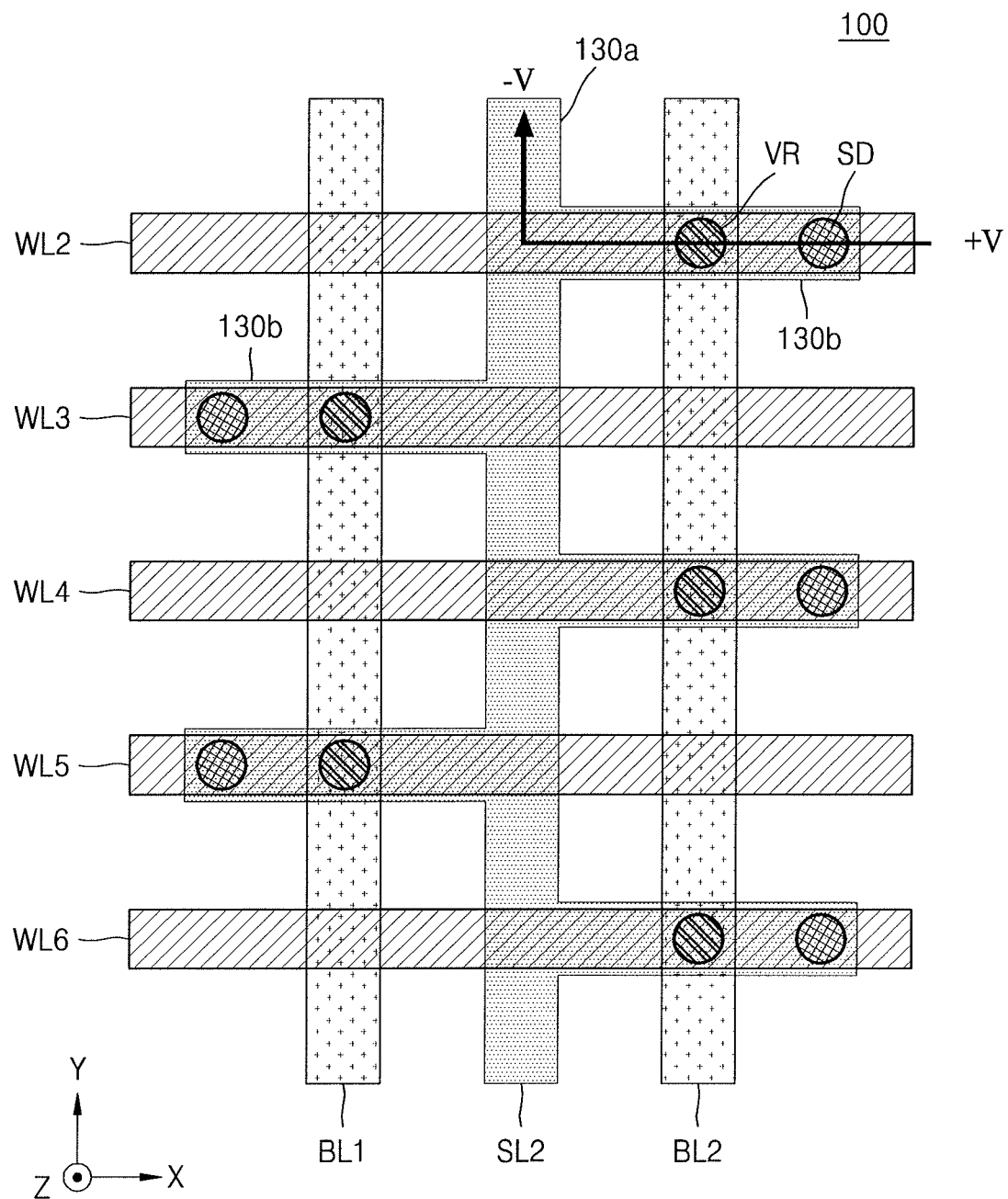
Figure 8:
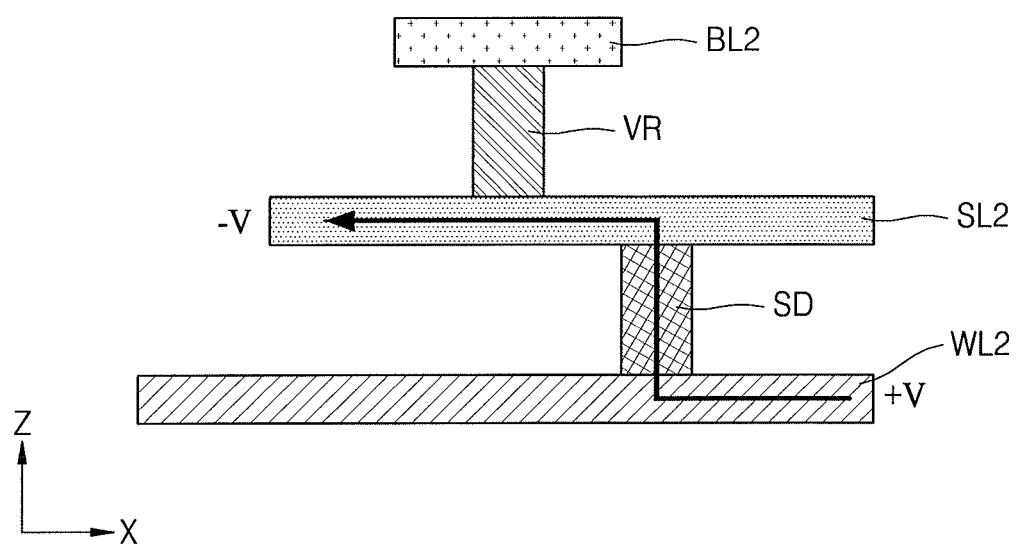

FIGS. 6 to 8 are diagrams for describing the principle of writing data "0" in a variable resistance memory device according to an embodiment. In FIGS. 1 to 3 and 6 to 8, like reference numerals refer to like elements. In FIGS. 6 to 8, descriptions which are the same as or similar to the descriptions of FIGS. 1 to 3 are omitted or only briefly given.

When data "0" is to be written in a selected memory cell MC, word lines WL1 and WL3 to WL6, bit lines BL1 to BL3, and source lines SL1, SL3, and SL4 may be floated and a certain voltage may be applied to a second word line WL2 and a second source line SL2. In other words, when a certain voltage is applied to the second word line WL2 and the second source line SL2, data "0" may be written in the selected memory cell MC.

When a positive voltage (+V or a high voltage) is applied to the second word line WL2 and a negative voltage (-V or a low voltage) is applied to the second source line SL2, a first current path illustrated by an arrow may be generated and data "0" may be written in the selected memory cell MC. A current may flow to a write driver and sense amplifier region 30 via the second word line WL2, a bipolar selection device SD, and the second source line SL2 as in the first current path illustrated by an arrow.

The positive voltage (+V or a high voltage) applied to the second word line WL2 may be, e.g., 1.2 V, and the negative voltage (-V or a low voltage) applied to the second source line SL2 may be, e.g., 0 V. However, the positive voltage and the negative voltage are merely exemplary numerical values and are not limited.

As described above, in the variable resistance memory device 100 according to an embodiment, word lines WL1 to WL6 (120) electrically connected to bipolar selection devices SD and sub-source lines 130b (or source lines SL1 to SL3) electrically connected to variable resistance layers VR may be write lines for writing data "0" in the variable resistance layers VR.

Figure 9:
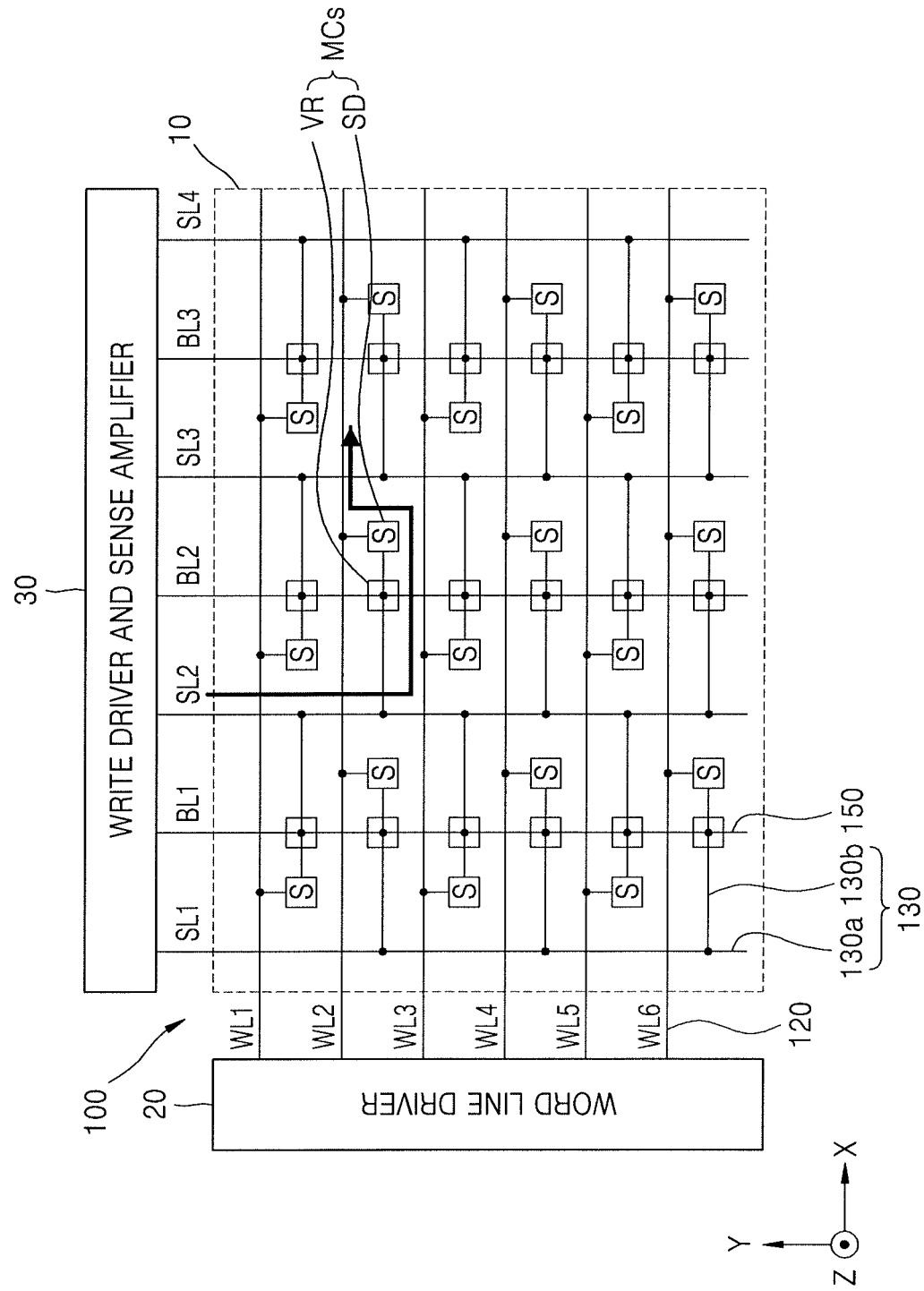
FIGS. 9 to 11 illustrate diagrams for describing writing data "1" in a variable resistance memory device according to an embodiment.
Figure 10:
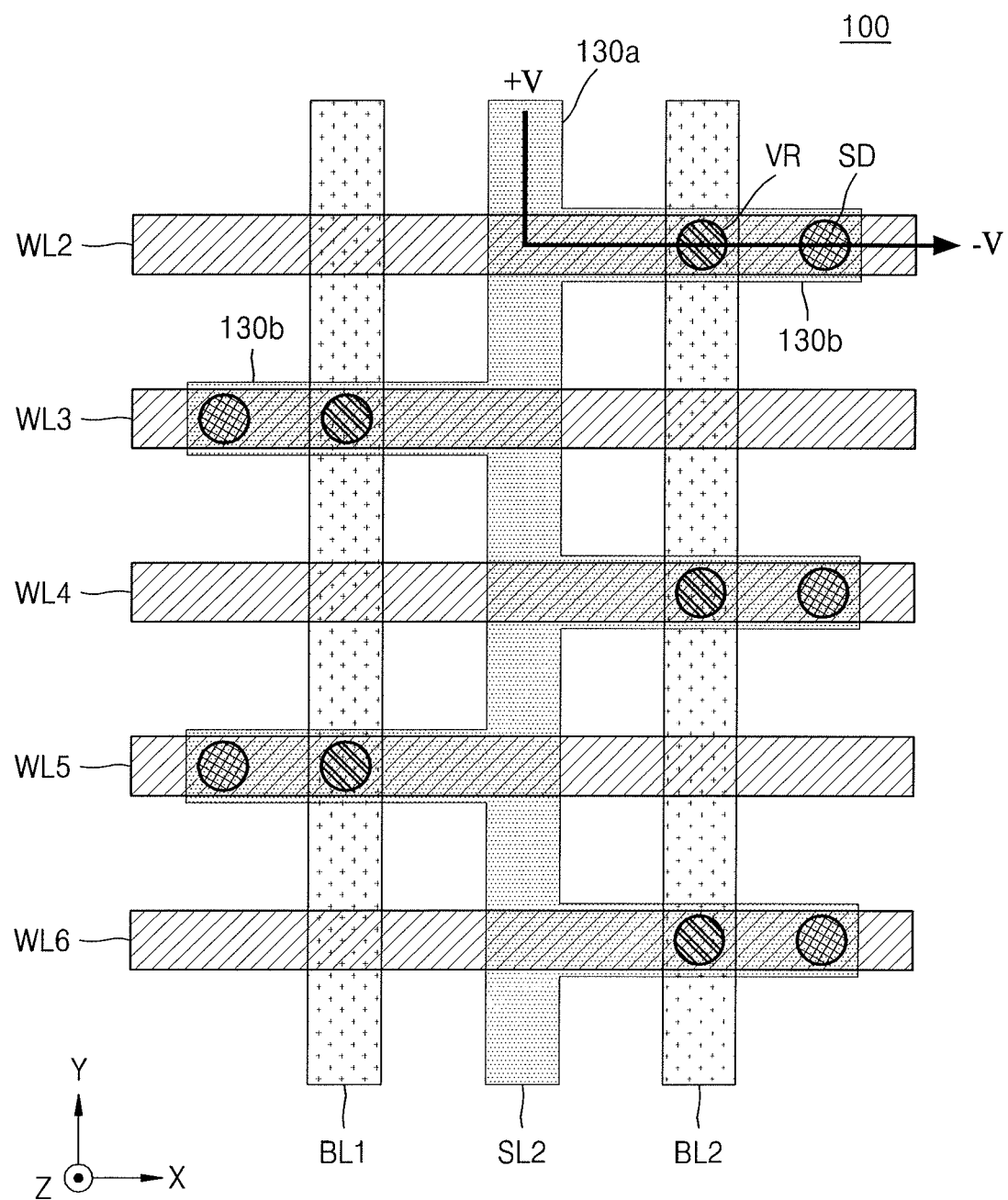
Figure 11:
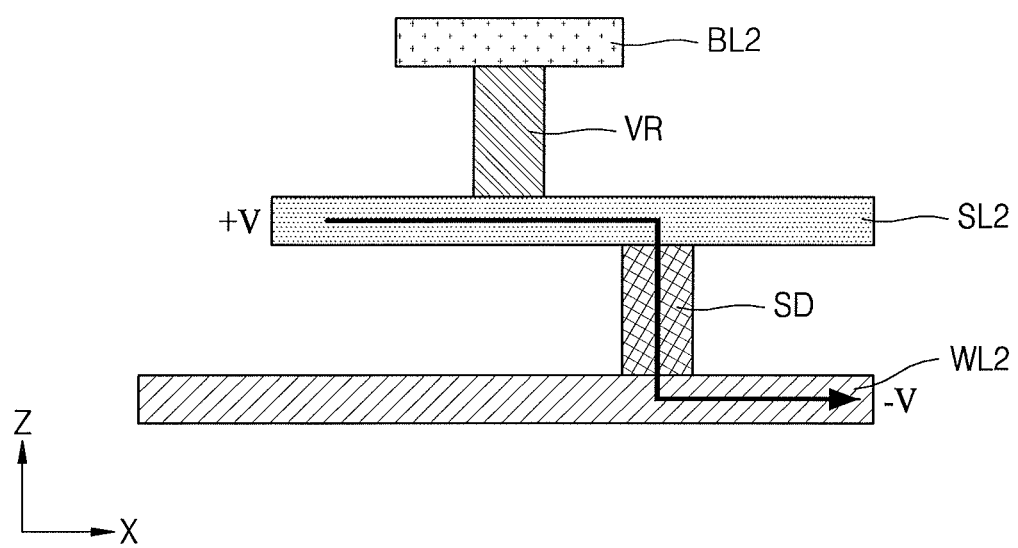

FIGS. 9 to 11 are diagrams for describing the principle of writing data "1" in a variable resistance memory device according to an embodiment. In FIGS. to 3 and 9 to 11, like reference numerals refer to like elements. In FIGS. 9 to 11, descriptions which are the same as or similar to the descriptions of FIGS. 1 to 3 are omitted or only briefly given.

When data "1" is to be written in a selected memory cell MC, word lines WL1 and WL3 to WL6, bit lines BL1 to BL3, and source lines SL1, SL3, and SL4 may be floated and a certain voltage may be applied to a second word line WL2 and a second source line SL2. In other words, when a certain voltage is applied to the second word line WL2 and the second source line SL2, data "1" may be written in the selected memory cell MC.

When a negative voltage (−V or a low voltage) is applied to the second word line WL2 and a positive voltage (+V or a high voltage) is applied to the second source line SL2, a first current path illustrated by an arrow may be generated and data "1" may be written in the selected memory cell MC. A current may flow to a word line driver region 20 via the second source line SL2, a bipolar selection device SD, and the second word line WL2 as in the first current path illustrated by an arrow.

The positive voltage (+V or a high voltage) applied to the second source line SL2 may be, e.g., 1.2 V, and the negative voltage (−V or a low voltage) applied to the second word line WL2 may be, e.g., 0 V. However, the positive voltage and the negative voltage are merely exemplary numerical values and are not limited.

As described above, in the variable resistance memory device 100 according to an embodiment, word lines WL1 to WL6 (120) electrically connected to bipolar selection devices SD and sub-source lines 130b (or source lines SL1 to SL3) electrically connected to variable resistance layers VR may be write lines for writing data "1" in the variable resistance layers VR.

In FIGS. 6 to 8, current flow for writing data "0" in a selected memory cell MC is illustrated, and in FIGS. 9 to 11, current flow for writing data "1" in a selected memory cell MC is illustrated. Alternatively, data "1" may be written in a memory cell MC selected by the current flow illustrated in FIGS. 6 to 8, and data "0" may be written in a memory cells MC selected by the current flow illustrated in FIGS. 9 to 11.

Figure 12:
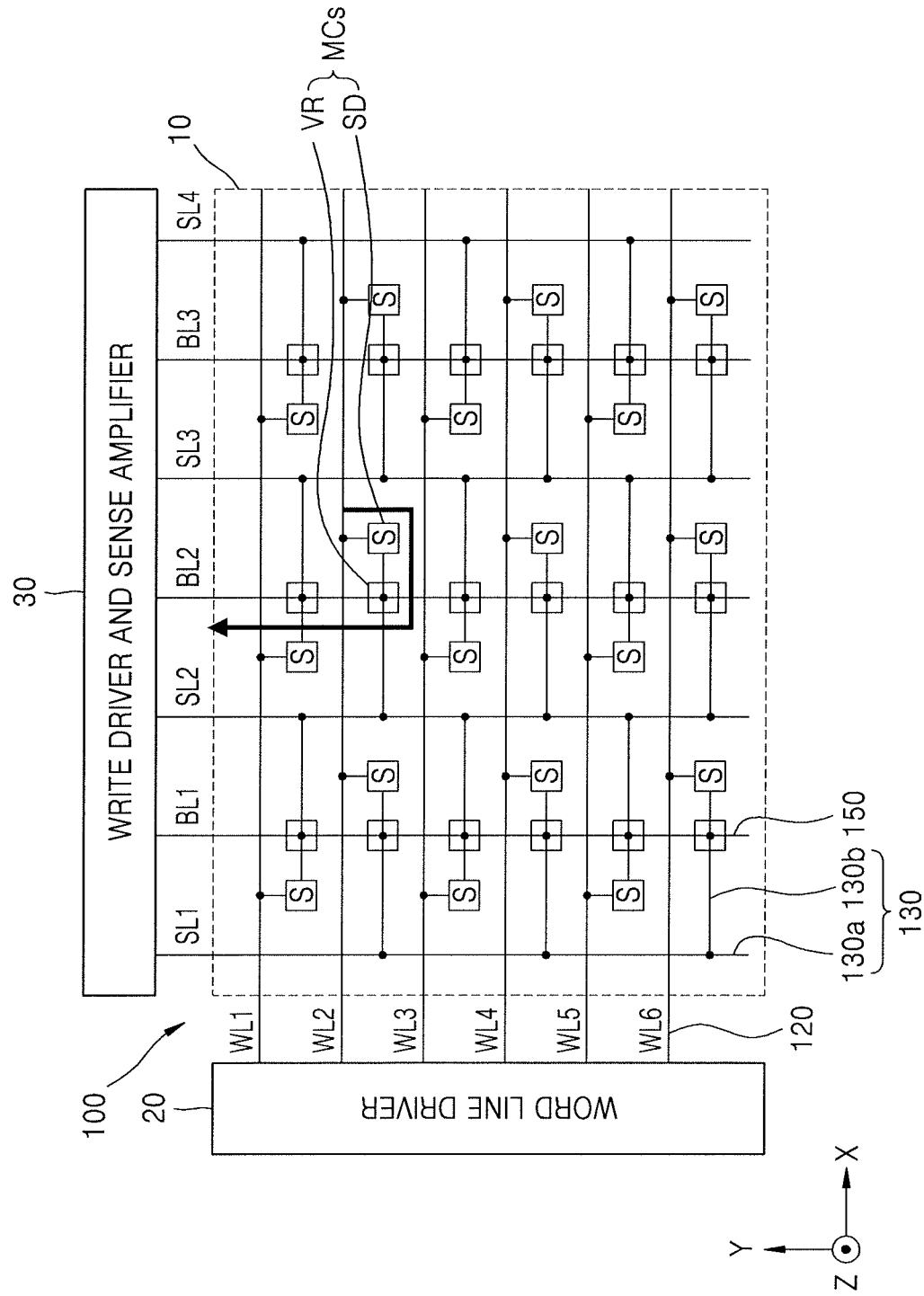
FIGS. 12 to 14 illustrate diagrams for describing writing data "1" or "0" in a variable resistance memory device according to an embodiment.
Figure 13:
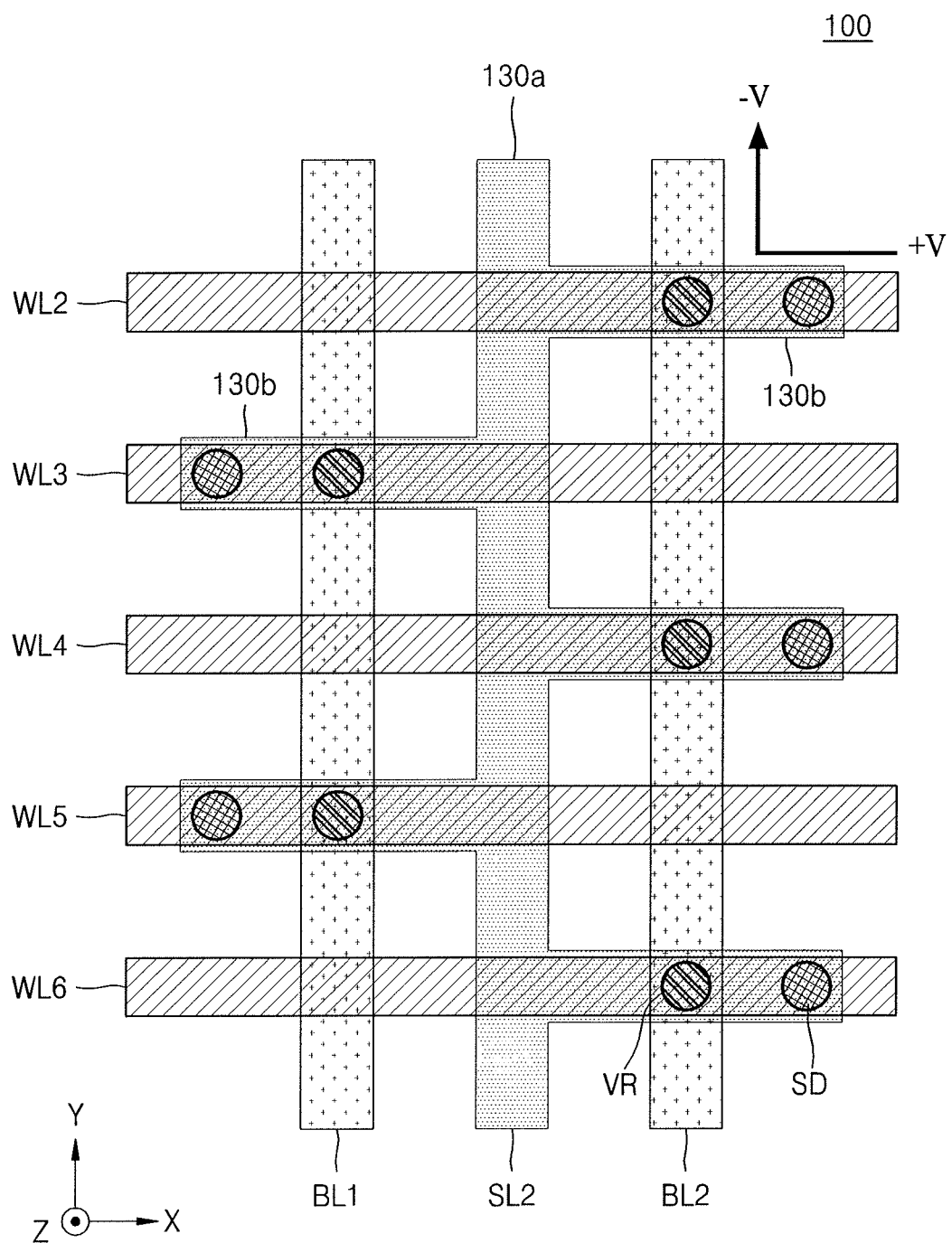
Figure 14:
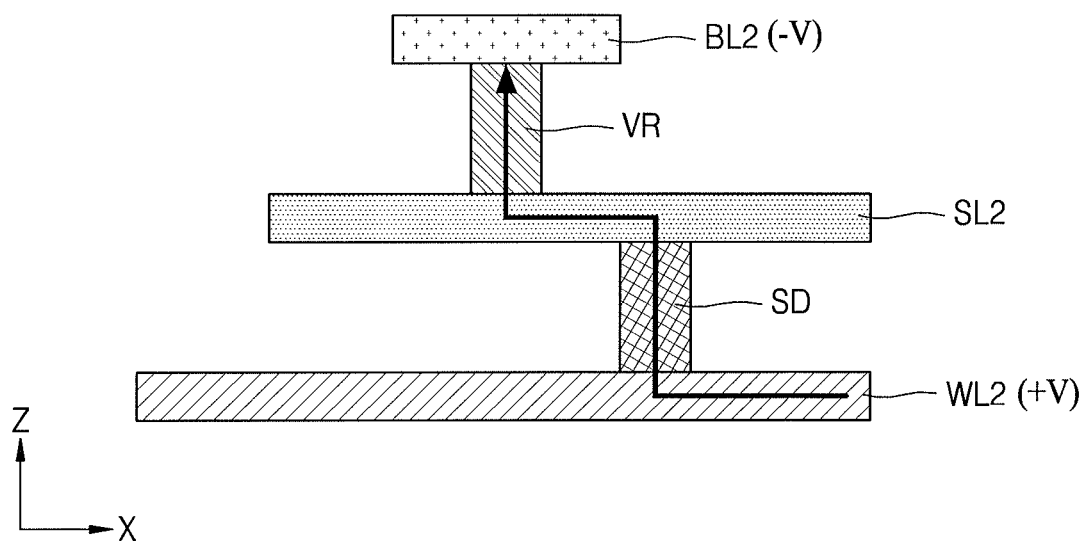

FIGS. 12 to 14 are diagrams for describing the principle of writing data "1" or "0" in a variable resistance memory device according to an embodiment. In FIGS. 1 to 3 and 12 to 14, like reference numerals refer to like elements. In FIGS. 12 to 14, descriptions which are the same as or similar to the descriptions of FIGS. 1 to 3 are omitted or only briefly given.

When data "0" or "1" is to be read from a selected memory cell MC, word lines WL1 and WL3 to WL6, bit lines BL1 to BL3, and source lines SL1 to SL4 may be floated and a certain voltage may be applied to a second word line WL2 and a second bit line BL2. In other words, when a certain voltage is applied to the second word line WL2 and the second bit line BL2, the data "0" or "1" may be read based on a resistance value of a variable resistance layer VR of the selected memory cell MC that is in the current path.

When a positive voltage (+V or a high voltage) is applied to the second word line WL2 and a negative voltage (−V or a low voltage) is applied to the second bit line BL2, a second current path illustrated by an arrow may be generated and data "0" or "1" may be read based on a resistance value of a variable resistance layer VR of the selected memory cell MC. A current may flow to a write driver and sense amplifier region 30 via the second word line WL2, a bipolar selection device SD, the second source line SL2, the variable resistance layer VR, and the second bit line BL2 as in the second current path illustrated by an arrow.

The negative voltage (or a low voltage) applied to the second bit line BL2 may be, e.g., 0 V. and the positive voltage (or a high voltage) applied to the second word line WL2 may be, e.g., 1.2 V. However, the positive voltage and the negative voltage are merely exemplary numerical values and are not limited. In FIGS. 12 to 14, the positive voltage (+V or a high voltage) may be applied to the second word line WL2 and the negative voltage (−V or a low voltage) may be applied to the second bit line BL2, but the negative voltage (−V or a low voltage) may be applied to the second word line WL2 and the positive voltage (+V or a high voltage) may be applied to the second bit line BL2.

As described above, in the variable resistance memory device 100 according to an embodiment, word lines WL1 to WL6 (120) electrically connected to bipolar selection devices SD and sub-source lines 130b (or source lines SL1 to SL3) and bit lines BL1 to BL3 (150) electrically connected to variable resistance layers VR may be read lines for reading data "1" and "0" written in the variable resistance layers VR.

Figure 15:
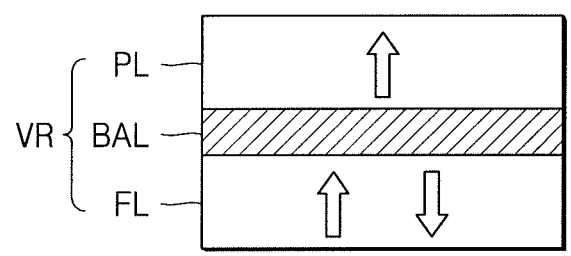
FIG. 15 illustrates a cross-sectional view of a variable resistance layer included in a variable resistance memory device according to an embodiment.

FIG. 15 is a cross-sectional view for describing a variable resistance layer included in a variable resistance memory device according to an embodiment.

In detail, the variable resistance layer VR may include the free layer FL, the pinned layer PL, and the barrier layer BAL disposed between the free layer FL and the pinned layer PL. The variable resistance layer VR may include an SOT MTJ device.

A magnetization direction of the free layer FL may be provided vertical to a film surface of the free layer FL. The magnetization direction of the free layer FL may vary based on a condition. A magnetization direction of the pinned layer PL may be provided vertical to a film surface of the pinned layer PL. The magnetization direction of the pinned layer PL may be fixed. The variable resistance layer VR may be a vertical magnetic device where the magnetization direction of the free layer FL is vertical to the magnetization direction of the pinned layer PL. A resistance value of the variable resistance layer VR may vary based on the magnetization direction of the free layer FL.

When a magnetization direction of the free layer FL is parallel to a magnetization direction of the pinned layer PL, the variable resistance layer VR may have a low resistance value and may store data "0". When a magnetization direction in the free layer FL is anti-parallel to a magnetization direction in the pinned layer PL, the variable resistance layer VR may have a high resistance value and may store data "1".

When the variable resistance layer VR is an SOT MTJ device, the free layer FL may be disposed under the variable resistance layer VR and the pinned layer PL may be disposed on the variable resistance layer VR. Alternatively, data stored in the variable resistance layer VR may be inversely changed based on the magnetization direction of the free layer FL.

The free layer FL may be a magnetic layer having a variable magnetization direction. In some embodiments, the free layer FL may include a ferromagnetic material, e.g., at least one of cobalt (Co), iron (Fe), and nickel (Ni)) having a magnetic moment where a magnetization direction is freely changed vertical to a layer surface, and moreover, may further include another material, e.g., boron (B), chromium (Cr), platinum (Pt), or palladium (Pd). The free layer FL may include a material which differs from that of the pinned layer PL, or may include the same material as that of the pinned layer PL.

In some embodiments, in order to implement a variable resistance layer where a magnetization direction is vertical, each of the free layer FL and the pinned layer PL may include a material which is high in magnetic anisotropic energy. The material which is high in magnetic anisotropic energy may include a multi-layer thin film such as an amorphous rare-earth element alloy, (Co/Pt)n, or (Fe/Pt)n. Here, n may be a positive integer.

For example, the free layer FL may be an ordered alloy and may include at least one of Fe, Co, Ni, Pd, and Pt. For example, the free layer FL may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. When the alloys are represented chemical quantitatively, the alloys may include, e.g., $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $CO_{30}Fe_{20}Pt_{50}$, or $Co_{30}Ni_{20}Pt_{50}$.

For example, the pinned layer PL may be an ordered alloy and may include at least one of Fe, Co, Ni, Pd, and Pt. For example, the pinned layer PL may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. When the alloys are represented chemical quantitatively, the alloys may include, e.g., $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

The pinned layer PL may be a magnetic layer having a fixed magnetization direction. In some embodiments, a ferromagnetic material included in the pinned layer PL may include at least one of Co, Fe, and Ni, and for example, may further include other materials such as B, Cr, Pt, and Pd. In the present embodiment, the pinned layer PL is illustrated as one single layer, but the pinned layer PL is not limited thereto and may have a multi-layer structure.

In some embodiments, the pinned layer PL may have a multi-layer structure where a first layer including at least one of Co and a Co alloy and a second layer including at least one of Pt, Ni, and Pd are alternately stacked, or may be a FePt layer or a CoPt layer having an L 10 structure or an alloy layer of a rare-earth element and transition metal. Here, the rare-earth element may include at least one of Tb and Gd, and the transition metal may include at least one of Ni, Fe, and Co. An alloy of the rare-earth element and the transition metal based on various combinations may be used, and for example, CoFeB or CoFe may be used as a material of the pinned layer PL.

The barrier layer BAL may be disposed between the free layer FL and the pinned layer PL, for increasing a tunnel magnetoresistance ratio (TMR) of the variable resistance layer VR. In some embodiments, the barrier layer BAL may have a thickness of about 8 Å to about 15 Å. The barrier layer BAL may have a thickness which is thinner than a spin diffusion distance. The barrier layer BAL may include a non-magnetic material. The barrier layer BAL may include, e.g., at least one material selected from among magnesium (Mg), titanium (Ti), aluminum (Al), oxides such as Mg-zinc (MgZn) and Mg-boron (MgB), and nitride including Ti and vanadium (V). The barrier layer BAL may have, e.g., a multi-layer structure.

In some embodiments, the free layer FL, the barrier layer BAL, and the pinned layer PL may have the same crystalline structure. For example, each of the free layer FL, the barrier layer BAL, and the pinned layer PL may have a body centered cubic (BCC) crystalline structure.

Figure 16:
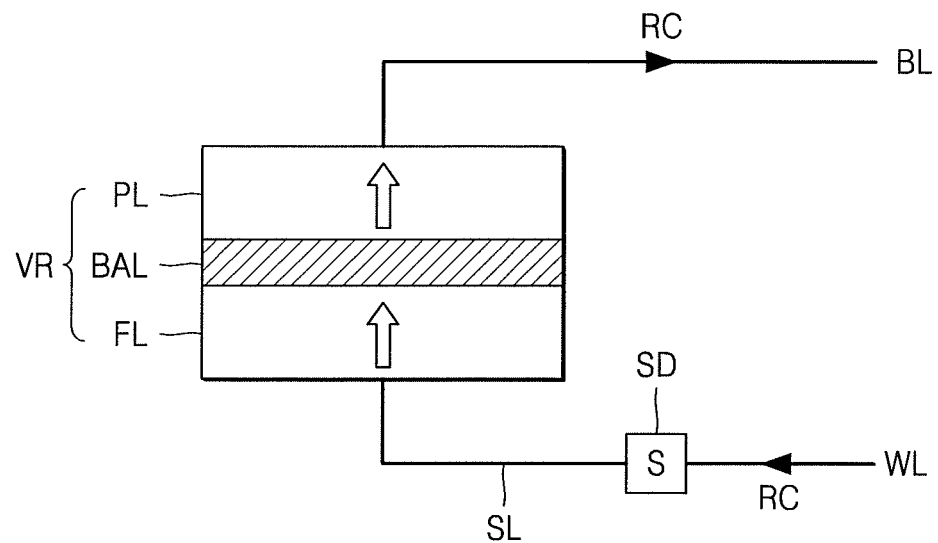
FIGS. 16 and 17 illustrate diagrams of reading data written in a variable resistance layer in a variable resistance memory device according to an embodiment.
Figure 17:
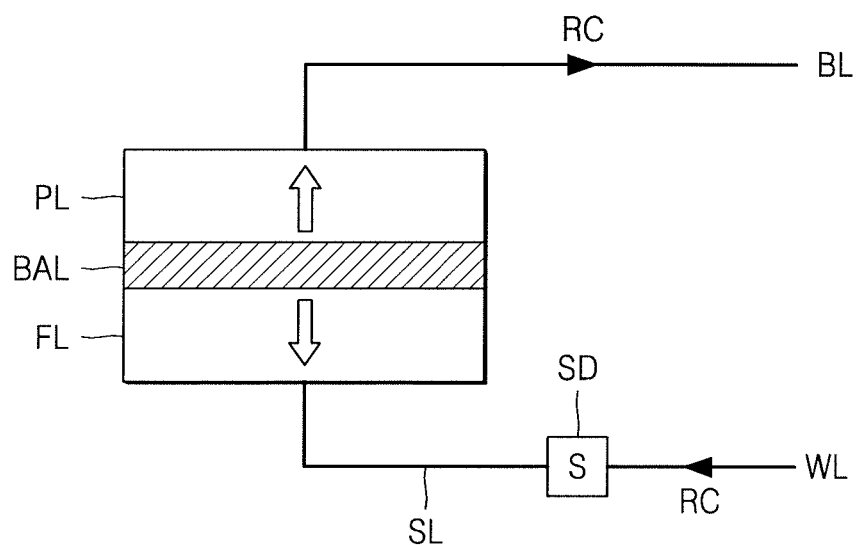

FIGS. 16 and 17 are diagrams for describing an operation of reading data written in a variable resistance layer included in a variable resistance memory device according to an embodiment.

In detail, each of FIGS. 16 and 17 illustrates a magnetization direction based on data written in a variable resistance layer VR. A resistance value of the variable resistance layer VR may vary based on a magnetization direction of a free layer FL. When a read current RC flows to the variable resistance layer VR through a word line WL, a bipolar selection device SD, a source line SL, and a bit line BL, a data voltage based on the resistance value of the variable resistance layer VR may be output. Strength of the read current RC may be far less than that of a write current, and a magnetization direction of the free layer FL may not vary based on the read current RC.

Referring to FIG. 16, the magnetization direction of the free layer FL may be parallel to a magnetization direction of a pinned layer PL in the variable resistance layer VR. Here, the variable resistance layer VR may have a low resistance value. In this case, when the read current RC flows to the variable resistance layer VR, data "0" may be read from the variable resistance layer VR.

Referring to FIG. 17, a magnetization direction of a free layer FL may be anti-parallel to a magnetization direction of a pinned layer PL in a variable resistance layer VR. Here, the variable resistance layer VR may have a high resistance value. In this case, when a read current RC flows to the variable resistance layer VR, data "1" may be read from the variable resistance layer VR.

Figure 18:
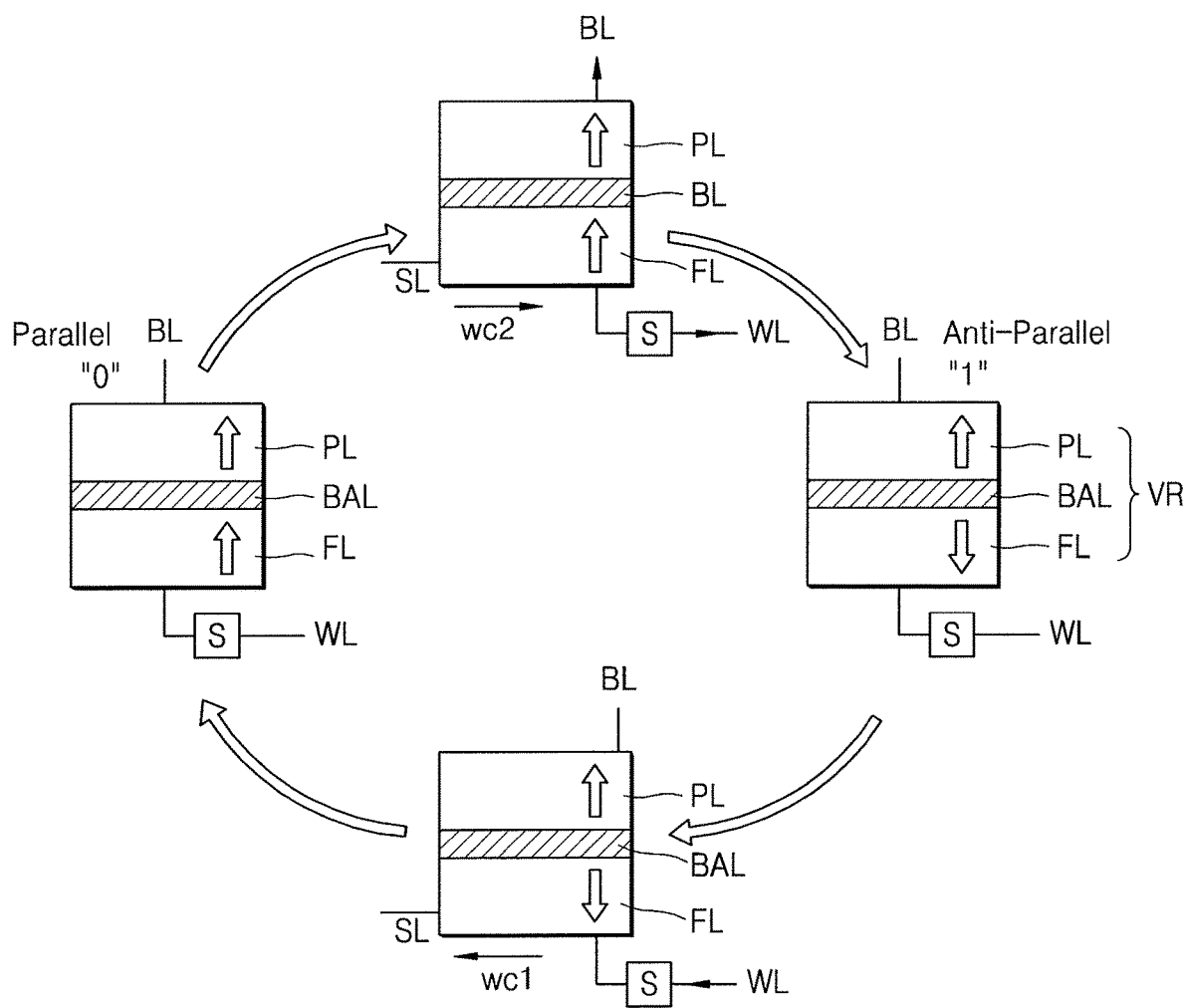
FIG. 18 illustrates a diagram of a write operation performed on a variable resistance layer in a variable resistance memory device according to an embodiment.

FIG. 18 is a diagram for describing a write operation performed on a variable resistance layer included in a variable resistance memory device according to an embodiment.

In detail, a magnetization direction of a free layer FL may be determined based on directions of write currents (for example, a first write current and a second write current) wc1 and wc2 flowing in a variable resistance layer VR. For example, when the first write current wc1 is applied in a direction from a word line WL to the free layer FL, free electrons having the same spin direction as that of a pinned layer PL may apply SOT to the free layer FL. Therefore, the free layer FL may be magnetized to be parallel to the pinned layer PL.

When the second write current wc2 is applied in a direction from a source line SL to the free layer FL, electrons having spin opposite to that of the pinned layer PL may return to the free layer FL and may apply SOT to the free layer FL. Therefore, the free layer FL may be magnetized to be anti-parallel to the pinned layer PL. That is, the magnetization direction of the free layer FL may vary based on SOT in the variable resistance layer VR.

Figure 19:
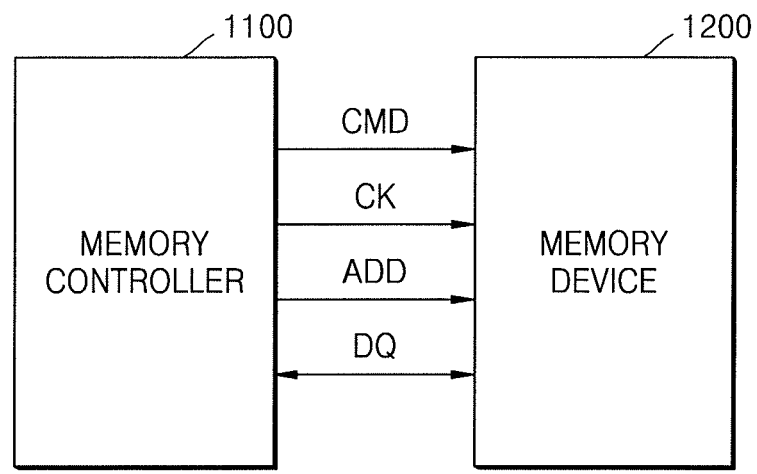
FIG. 19 illustrates a semiconductor memory system including a variable resistance memory device according to an embodiment.

FIG. 19 illustrates a block diagram of a semiconductor memory system 1000 including a variable resistance memory device according to an embodiment.

The semiconductor memory system 1000 may include a memory controller 1100 and a memory device 1200. The memory controller 1100 may provide various signals, e.g., a command signal CMD, a clock signal CK, an address signal ADD, and a data signal DQ, for controlling the memory device 1200. Moreover, the memory controller 1100 may communicate with the memory device 1200 to provide the data signal DQ to the memory device 1200, or may receive the data signal DQ from the memory device 1200. The memory device 1200 may include the variable resistance memory device 100, e.g., MRAM, according to an embodiment described above with reference to FIGS. 1-4.

Figure 20:
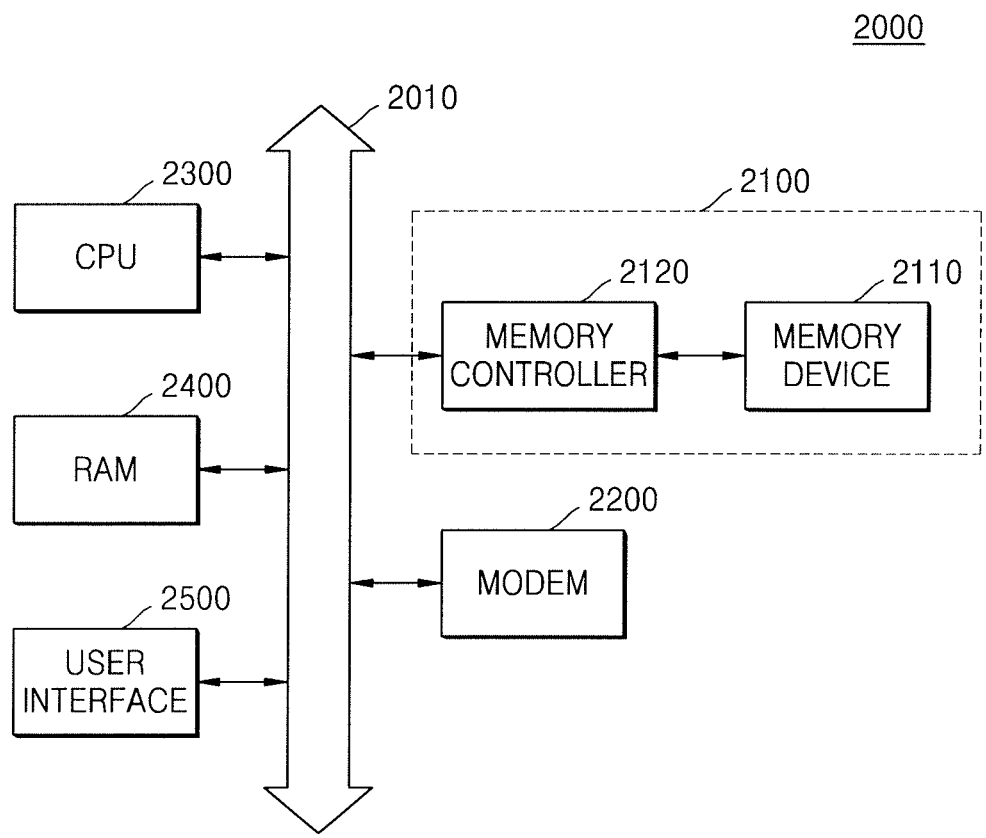
FIG. 20 illustrates an information processing system including a variable resistance memory device according to an embodiment.

FIG. 20 illustrates a block diagram for describing an information processing system 2000 including a variable resistance memory device according to an embodiment.

In detail, the information processing system 2000 may include a memory system 2100, a modem 2200, a central processing unit (CPU) 2300, RAM 2400, and a user interface 2500, which are electrically connected to a bus 2010.

The memory system 2100 may include a memory device 2110 and a memory controller 2120. Data obtained through processing by the CPU 2300 or data input from the outside may be stored in the memory system 2100.

At least one of the memory system 2100, the CPU 2300, and the RAM 2400 may include the variable resistance memory device 100 according to an embodiment described above with reference to FIGS. 1 to 4. The information processing system 2000 may be applied to portable computers, web tablet personal computers, wireless phones, mobile phones, digital music players, memory cards, MP3 players, navigation devices, portable multimedia players (PMPs), solid state disks (SSDs), and household appliances.

Figure 21:
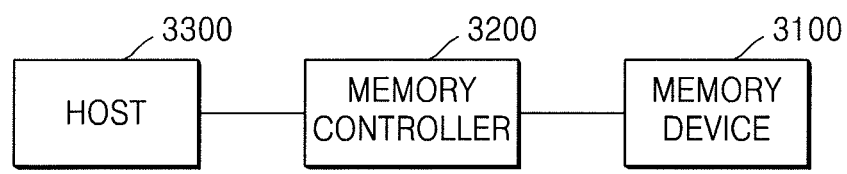
FIG. 21 illustrates a memory card including a variable resistance memory device according to an embodiment.

FIG. 21 illustrates a block diagram for describing a memory card 3000 including a variable resistance memory device according to an embodiment.

In detail, the memory card 300 may include a memory device 3100 and a memory controller 3200. The memory device 3100 may store data. The memory device 3100 may include the variable resistance memory device 100 according to an embodiment described above with reference to FIGS. 1 to 4. In response to a read/write request from a host 3300, the memory controller 3200 may read data stored in the memory device 3100, or may store data in the memory device 3100.

By way of summation and review, embodiments provide a variable resistance memory device for decreasing a size of a memory cell array. Embodiments also provide a variable resistance memory device including a memory cell array for easily writing and reading data "1" and "0" in and from memory cells and preventing disturbance in a read operation.

That is, according to embodiments, a variable resistance memory device includes a memory cell with a variable resistance layer and a bipolar selection device, e.g., as opposed to a regular transistor, so it may perform a write operation and a read operation by using only three conductive lines, e.g., as opposed to four conductive lines, thereby decreasing the number of the conductive lines, which in turn, decreases the size of the memory cell array. Further, the variable resistance layer of the memory cell, according to embodiments, may be configured with a spin orbit torque (SOT) magnetic tunnel junction device, e.g. as opposed to spin transfer torque (STT), so current paths in the write and read operations may be different from each other, thereby facilitating write and read operations without write disturbance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a first conductive line;
a bipolar selection device on the first conductive line, the bipolar selection device being directly and electrically connected to the first conductive line;
a second conductive line on the first conductive line and electrically connected to the bipolar selection device;
a variable resistance pattern on the second conductive line, the variable resistance pattern being directly and electrically connected to the second conductive line; and
a third conductive line on the variable resistance pattern and electrically connected to the variable resistance pattern,
wherein the variable resistance pattern is between the second conductive line and the third conductive line, and
wherein the bipolar selection device is between the second conductive line and the first conductive line, the bipolar selection device being spaced apart from and having a non-overlapping relationship, in the top view, with the third conductive line.

2. The variable resistance memory device as claimed in claim 1, wherein the bipolar selection device and the variable resistance pattern define a unit memory cell.

3. The variable resistance memory device as claimed in claim 1, wherein the first conductive line extends in a first direction, the third conductive line extends in a second direction vertical to the first conductive line, and the variable resistance pattern is at an intersection portion of the first conductive line and the third conductive line.

4. The variable resistance memory device as claimed in claim 1, wherein the variable resistance pattern includes a spin orbit torque magnetic tunnel junction device, and the bipolar selection device includes a bipolar diode.

5. The variable resistance memory device as claimed in claim 1, wherein the first conductive line is a word line, the second conductive line is a source line, and the third conductive line is a bit line.

6. The variable resistance memory device as claimed in claim 1, wherein each of the first conductive line electrically connected to the bipolar selection device and the second conductive line electrically connected to the variable resistance pattern includes a write line for writing data "0" or "1" in the variable resistance pattern.

7. The variable resistance memory device as claimed in claim 1, wherein each of the first conductive line electrically connected to the bipolar selection device and the second and third conductive lines electrically connected to the variable resistance pattern includes a read line for reading data "0" or "1" written in the variable resistance pattern.

8. A variable resistance memory device, comprising:
word lines extending in a first direction and spaced apart from one another in a second direction vertical to the first direction;
source lines on the word lines, each of the source lines including:
main source lines extending in the second direction and spaced apart from one another in the first direction, and
sub-source lines extending in the first direction and spaced apart from one another in the second direction, the sub-source lines extending from respective ones of the main source lines and in opposite directions along the main source lines;
bit lines on the word lines and the sub-source lines, the bit lines extending in the second direction between the main source lines and spaced apart from one another in the first direction;
variable resistance layers at intersection portions of the word lines and the bit lines on the sub-source lines; and bipolar selection devices between the word lines and the sub-source lines and spaced apart from the intersection portions.

9. The variable resistance memory device as claimed in claim 8, wherein one variable resistance layer of the variable resistance layers at an intersection portion of a corresponding word line and a corresponding bit line and one bipolar selection device of the bipolar selection devices between a corresponding word line and a corresponding sub-source line define a unit memory cell.

10. The variable resistance memory device as claimed in claim 9, wherein the unit memory cell is provided in plurality, and the plurality of unit memory cells are disposed in opposite directions along the bit lines in the second direction.

11. The variable resistance memory device as claimed in claim 8, wherein the bipolar selection devices are disposed in opposite directions along the bit lines in the second direction.

12. The variable resistance memory device as claimed in claim 8, wherein each of the variable resistance layers includes a spin orbit torque magnetic tunnel junction device, and each of the bipolar selection devices includes a bipolar diode.

13. The variable resistance memory device as claimed in claim 8, wherein the bipolar selection devices are electrically connected to the word lines and the sub-source lines, and the variable resistance layers are electrically connected to the sub-source lines and the bit lines.

14. The variable resistance memory device as claimed in claim 13, wherein the word lines electrically connected to the bipolar selection devices and the sub-source lines electrically connected to the variable resistance layers include write lines for writing data "0" or "1" in the variable resistance layers.

15. The variable resistance memory device as claimed in claim 13, wherein the word lines electrically connected to the bipolar selection devices and the sub-source lines and bit lines electrically connected to the variable resistance layers include read lines for reading data "0" or "1" written in the variable resistance layers.

16. A variable resistance memory device, comprising:
word lines extending along a first direction and spaced apart from one another in a second direction vertical to the first direction;
bit lines on the word lines, the bit lines extending in the second direction and spaced apart from one another in the first direction;
source lines between the word lines and the bit lines, each of the source lines including:
main source lines extending in the second direction and spaced apart from one another in the first direction between the bit lines, and
sub-source lines extending in the first direction and spaced apart from one another in the second direction, the sub-source lines extending from respective ones of the main source lines in opposite directions along the main source lines and crossing the bit lines;
variable resistance layers at intersection portions of the word lines and the bit lines on the sub-source lines, and electrically connected to the bit lines and the sub-source lines, each of the variable resistance layers including a spin orbit torque magnetic tunnel junction device; and
bipolar selection devices between the word lines and the sub-source lines, spaced apart from the intersection portions, and electrically connected to the sub-source lines and the word lines, each of the bipolar selection devices including a bipolar diode.

17. The variable resistance memory device as claimed in claim 16, wherein one variable resistance layer of the variable resistance layers at an intersection portion of a corresponding word line and a corresponding bit line and one bipolar selection device of the bipolar selection devices disposed between a corresponding word line and a corresponding sub-source line configure a unit memory cell, the unit memory cell is provided in plurality, and the plurality of unit memory cells are disposed in opposite directions along the bit lines in the second direction.

18. The variable resistance memory device as claimed in claim 16, wherein the word lines electrically connected to the bipolar selection devices and the sub-source lines electrically connected to the variable resistance layers include write lines for writing data "0" or "1" in the variable resistance layers.

19. The variable resistance memory device as claimed in claim 16, wherein the word lines electrically connected to the bipolar selection devices and the sub-source lines and bit lines electrically connected to the variable resistance layers include read lines for reading data "0" or "1" written in the variable resistance layers.

\* \* \* \* \*